United States Patent
Bielas

(10) Patent No.: US 9,157,741 B2
(45) Date of Patent: Oct. 13, 2015

(54) SIMULATOR FOR SIMULATING THE OPERATION OF A FIBER OPTIC GYROSCOPE

(71) Applicant: Raytheon Company, Waltham, MA (US)

(72) Inventor: Michael S. Bielas, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 294 days.

(21) Appl. No.: 13/829,370

(22) Filed: Mar. 14, 2013

(65) Prior Publication Data
US 2015/0025856 A1    Jan. 22, 2015

(51) Int. Cl.
G01C 19/66   (2006.01)
G01J 1/42    (2006.01)
G06F 17/50   (2006.01)
G01C 19/72   (2006.01)

(52) U.S. Cl.
CPC ............ *G01C 19/66* (2013.01); *G01C 19/726* (2013.01); *G01J 1/42* (2013.01); *G06F 17/5009* (2013.01)

(58) Field of Classification Search
CPC .. G06F 17/5009; G06F 17/10; G06F 2217/16
See application file for complete search history.

(56) References Cited

U.S. PATENT DOCUMENTS

| | | | | |
|---|---|---|---|---|
| 5,090,809 A | * | 2/1992 | Ferrar | 356/460 |
| 5,914,781 A | * | 6/1999 | Jaklitsch et al. | 356/464 |
| 5,953,123 A | | 9/1999 | Jaklitsch et al. | |
| 5,999,304 A | * | 12/1999 | Sanders et al. | 359/237 |
| 6,445,455 B1 | * | 9/2002 | Hall et al. | 356/460 |
| 7,777,889 B2 | * | 8/2010 | Qiu et al. | 356/460 |
| 2006/0112382 A1 | * | 5/2006 | Glass et al. | 717/168 |
| 2008/0218764 A1 | | 9/2008 | Chen | |

OTHER PUBLICATIONS

Kay et al, "Serrodyne Modulator om a Fiber-Optic Gyroscope", IEE Proceedings, vol. 132, Pt. J, No. 5, Oct. 1985.*
Hoate et al, "Resonator Fiber Optic Gyro Using Digital Serrodyne Modulation Method to Reduce Noise Induced by the Backscattering and Closed-Loop Operation Using Digital Signal Processing", 13th International Conference on Optical Fiber Sensors, Apr. 12-16, 1999.*
Merlo et al, "Fiber Gyroscope Principles", Handbook of Fiber Optic Sensing Technology, John Wiley & Sons, 2000.*
Strandjord et al, "Effects of Imperfect Serrodyne Phase Modulation in Resonator Fiber Optic Gyroscopes", SPIE vol. 2292 Fiber Optic and Laser Sensors XII, 1994.*

(Continued)

*Primary Examiner* — Mary C Jacob

(57) ABSTRACT

A method includes simulating operation of a fiber optic gyroscope during a digital simulation. The simulation includes performing an iterative loop that includes simulating an intensity of light from a fiber coil of the fiber optic gyroscope and simulating operation of one or more control loops within the fiber optic gyroscope using the simulated intensity of the light. The intensity of the light is simulated using a sine/cosine function based on at least one angular rate-related effect injected into the simulation as a Sagnac phase shift. The simulated operation of a first of the one or more control loops attempts to reduce or eliminate the Sagnac phase shift. The method also includes storing, outputting, and/or using results of the simulation. The at least one angular rate-related effect could include rotation of the fiber coil and/or mechanical vibration of the fiber coil.

21 Claims, 7 Drawing Sheets

(56) References Cited

OTHER PUBLICATIONS

Youmans et al, "Design and Performance of a Fiber Optic Gyroscope Using Integrated Optics", SPIE vol. 1169 Fiber Optic and Laser Sensors VII, 1989.*

Jen-Dau Lin, et al., "Optimal design of a second-order fibre-optic gyroscope dynamic system", Measurement Science and Technology, vol. 5, No. 8, Aug. 1, 1994, p. 954-959.

A. Noureldin, et al., "Computer Modelling of Microelectronic Closed Loop Fiber Optic Gyroscope", Proceedings of the 1999 IEEE Canadian Conference on Electrical and Computer Engineering, May 9-12, 1999, p. 633-638.

Notification of Transmittal of the International Search Report and the Written Opinion of the International Searching Authority, or the Declaration dated Nov. 12, 2014 in connection with International Patent Application No. PCT/US2014/011316.

Ebrahim Ashouri, et al., "Modelling and Simulation of the Fiber Optic Gyroscope (FOG) in Measurement-While-Drilling (MWD) Processes", Proceedings of the 9th WSEAS International Conference on Signal Processing, Computational Geometry and Artificial Vision, 2009, p. 51-56.

Vinod, G, et al., "Modeling and Simulation of Closed Loop Fibre-Optic Gyroscope", ICOP 2009-International Conference on Optics and Photonics, Oct. 30-Nov. 2009, 4 pages.

Junliang Han, et al., "Modeling and Simulation of Digital Closed-loop Fiber Optic Gyroscope", Proceedings of the 6th World Congress on Intelligent Control and Automation, Jun. 21-23, 2006, p. 1659-1663.

Michael S. Bielas, "Stochastic and dynamic modeling of fiber gyros", SPIE vol. 2292 Fiber Optic and Laser Sensors XII (1994), p. 240-254.

Basak Secmen, "Simulation on Interferometric Fiber Optic Gyroscope with Amplified Optical Feedback", Sep. 2003, 99 pages.

Radha Madhuri Rajulapati, "Modeling and Simulation of Signal Processing for a Closed Loop Fiber Optic Gyro's Using FPGA", International Journal of Engineering Science and Technology (IJEST), Mar. 3, 2012, 13 pages.

* cited by examiner

SIMULATOR FOR SIMULATING THE OPERATION OF A FIBER OPTIC GYROSCOPE

TECHNICAL FIELD

This disclosure is directed generally to computer simulation. More specifically, this disclosure relates to a simulator for simulating the operation of a fiber optic gyroscope.

BACKGROUND

Fiber optic gyroscopes are used in a variety of applications to detect changes in orientation. For example, fiber optic gyroscopes can be used in the navigation systems of guided missiles and vehicles such as aircraft, spacecraft, ships, and submarines.

Fiber optic gyroscopes operate based on the interference generated by beams of light. In a conventional fiber optic gyroscope, a fiber optic cable is coiled, and beams of light are injected into the coil at opposite ends of the coil. Due to the Sagnac effect, rotation of the coil causes the light beam traveling in the direction of rotation to experience a slightly longer path delay than the light beam traveling in the opposite direction. This creates a small phase shift between the beams of light. This phase shift can be measured and used to precisely identify the angular velocity of the rotation experienced by the coil.

SUMMARY

This disclosure provides a simulator for simulating the operation of a fiber optic gyroscope.

In a first embodiment, a method includes simulating operation of a fiber optic gyroscope during a digital simulation. The simulation includes performing an iterative loop that includes simulating an intensity of light from a fiber coil of the fiber optic gyroscope and simulating operation of one or more control loops within the fiber optic gyroscope using the simulated intensity of the light. The intensity of the light is simulated using a sine/cosine function based on at least one angular rate-related effect injected into the simulation as a Sagnac phase shift. The simulated operation of a first of the one or more control loops attempts to reduce or eliminate the Sagnac phase shift. The method also includes storing, outputting, and/or using results of the simulation.

In a second embodiment, an apparatus includes at least one processing device configured to simulate operation of a fiber optic gyroscope during a digital simulation. The simulation includes an iterative loop in which the at least one processing device is configured to simulate an intensity of light from a fiber coil of the fiber optic gyroscope and simulate operation of one or more control loops within the fiber optic gyroscope using the simulated intensity of the light. The at least one processing device is configured to simulate the intensity of the light using a sine/cosine function based on at least one angular rate-related effect injected into the simulation as a Sagnac phase shift. The at least one processing device is configured to simulate operation of a first of the one or more control loops in order to reduce or eliminate the Sagnac phase shift. The apparatus also includes at least one memory configured to store results of the simulation.

In a third embodiment, a non-transitory computer readable medium embodies a computer program. The computer program includes computer readable program code for simulating operation of a fiber optic gyroscope during a digital simulation. The computer readable program code for simulating includes computer readable program code for, in an iterative loop, simulating an intensity of light from a fiber coil of the fiber optic gyroscope and simulating operation of one or more control loops within the fiber optic gyroscope using the simulated intensity of the light. The intensity of the light is simulated using a sine/cosine function based on at least one angular rate-related effect injected into the simulation as a Sagnac phase shift. The simulated operation of a first of the one or more control loops attempts to reduce or eliminate the Sagnac phase shift.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 7, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

Figure 1:
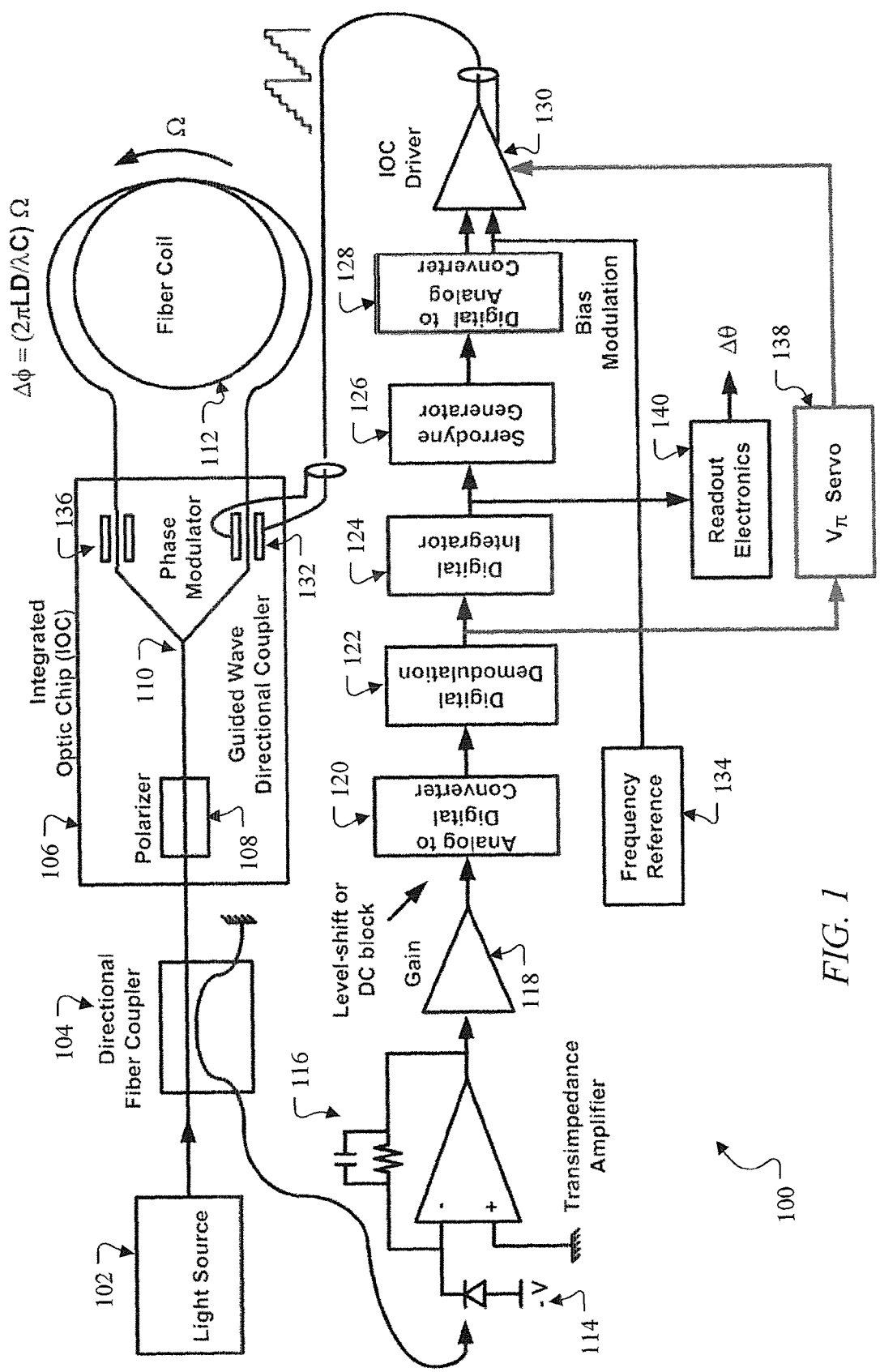
FIGS. 1 and 2 illustrate an example fiber optic gyroscope in accordance with this disclosure.
Figure 2:
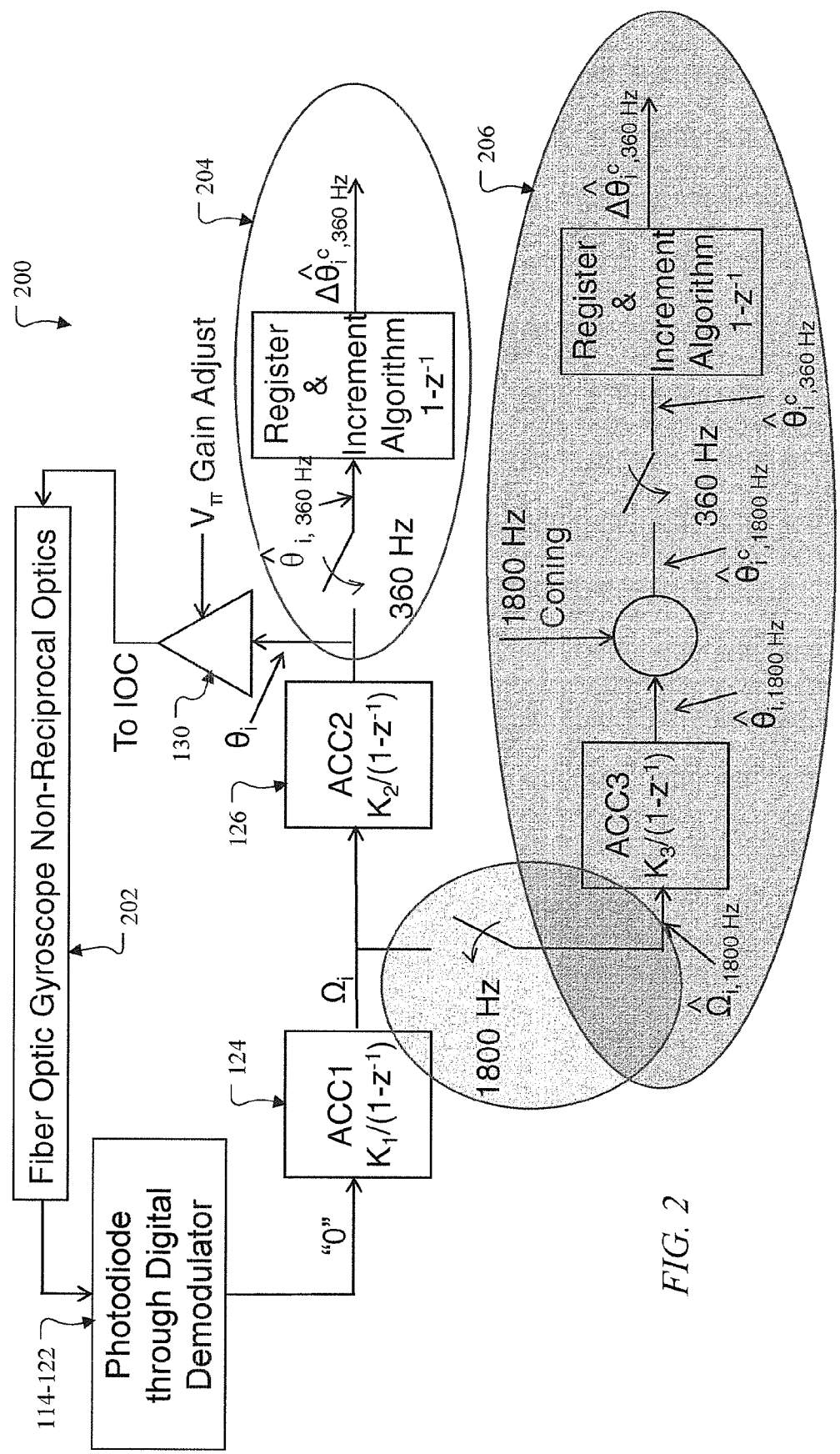

FIGS. 1 and 2 illustrate an example fiber optic gyroscope 100 in accordance with this disclosure. As shown in FIG. 1, the fiber optic gyroscope 100 includes a light source 102, which generates light to be used to measure changes in orientation. The light source 102 represents any suitable source of light, such as a broadband light source or a laser light source. Light from the light source 102 is provided to a directional fiber coupler 104, which provides at least a portion of the light to an integrated optic chip (IOC) 106. The directional fiber coupler 104 includes any suitable optical coupler, such as a 50/50 fiber coupler (also known as a splitter).

The integrated optic chip 106 here includes a polarizer 108 and a guided wave directional coupler 110. The polarizer 108 polarizes light, and the coupler 110 provides the polarized light to a fiber coil 112. In particular, the coupler 110 divides the polarized light and provides different beams of light to different ends of the fiber coil 112. The integrated optic chip 106 includes any suitable structure supporting the guiding of light, such as a lithium niobate ($LiNbO_3$) chip. The polarizer 108 includes any suitable structure for polarizing light. The coupler 110 includes any suitable structure for dividing light and providing light beams.

The fiber coil 112 represents a fiber optic cable that is wound to form multiple coils around an axis of rotation, which represents the axis around which rotation is to be sensed by the fiber optic gyroscope 100. The fiber coil 112 could represent any suitable fiber optic cable, such as a single-mode fiber optic cable with a Shupe winding. The fiber coil 112 could also have any suitable length.

The light from the guided wave directional coupler 110 travels through the coil 112 in both directions. The light exits the coil 112 and is provided back to the directional fiber coupler 104 via the integrated optic chip 106. The coupler 104 provides at least a portion of the returning light to a photodetector 114. The photodetector 114 measures intensities of the incoming light and provides an output current signal to a transimpedance amplifier 116, which converts the output current signal into an output voltage signal. A gain is applied to the output voltage signal by an amplifier 118. The photodetector 114 includes any suitable structure for converting light into an electrical signal, such as a photodiode. The transimpedance amplifier 116 includes any suitable structure for converting a current signal into a voltage signal. The amplifier 118 includes any suitable structure for amplifying an electrical signal.

The amplified voltage signal is provided to an analog-to-digital converter 120, which digitizes the voltage signal. The digitized values are provided to a digital demodulator 122, which demodulates the digitized values and generates output values that are proportional to the rotation of the coil 112. The output values from the demodulator 122 are integrated using a digital integrator 124, and outputs from the integrator 124 are provided to a serrodyne generator 126. The serrodyne generator 126 generates a waveform that is applied, via a digital-to-analog converter 128 and an IOC driver 130, to a phase modulator 132 in the integrated optic chip 106. The phase modulator 132 provides serrodyne modulation of the light entering or leaving the coil 112.

A frequency reference source 134 generates a signal having a bias frequency. This signal can be used to bias the serrodyne signal generated by the serrodyne generator 126. The bias signal could also be provided to a bias modulator 136, which provides bias modulation of the light entering or exiting the coil 112. A $V_\pi$ servo (also called a $V_{pi}$ servo) 138 provides a signal that controls the operation of the IOC driver 130. Readout electronics 140 can provide information to one or more operators, such as a measured rate of rotation or other information determined by the fiber optic gyroscope 100.

The analog-to-digital converter 120 includes any suitable structure for converting an analog signal into digital values. The digital demodulator 122 includes any suitable structure for digitally demodulating a signal. The digital integrator 124 includes any suitable structure for digitally integrating a signal. Any suitable integration technique could be used by the digital integrator 124, such as a rectangle integration technique or a higher-fidelity integration technique. The serrodyne generator 126 includes any suitable structure for generating a waveform used in serrodyne modulation of light. The digital-to-analog converter 128 includes any suitable structure for converting digital values into an analog signal. The IOC driver 130 includes any suitable structure for driving a phase modulator. The phase modulator 132 includes any suitable structure for phase modulating light. The frequency reference source 134 includes any suitable structure for generating a bias signal having at least one desired frequency. The bias modulator 136 includes any suitable structure for phase biasing light. The $V_\pi$ servo 138 includes any suitable structure for controlling an IOC driver. The readout electronics 140 include any suitable structure for providing information to an operator, such as a display device.

FIG. 2 illustrates example operation of a serrodyne control loop 200 in the fiber optic gyroscope 100 of FIG. 1 (note that the fiber optic gyroscope 100 also includes a $V_\pi$ control loop, which is not shown in FIG. 2). In FIG. 2, the optical characteristics of the fiber optic gyroscope 100 are represented as non-reciprocal optics 202. Light from the optics 202 is sampled and processed using the components 114-122 of the fiber optic gyroscope 100. The output of the digital demodulator 122 is shown here as being "0" because the control loop 200 generally operates to drive the demodulated output to zero. The digital integrator 124 here is represented using a first accumulator ACC1 and outputs a rotation rate $\Omega_i$. The serrodyne generator 126 here is represented using a second accumulator ACC2 and outputs a rotation angle $\theta_i$. The digital-to-analog converter 128 is omitted here for convenience.

As shown in FIG. 2, various approaches can be used to calculate changes to the rotation angle $\theta_i$. In one processing block 204, the rotation angle $\theta_i$ is sampled at a specified rate (such as 360 Hz) to generate a sampled signal $\hat{\theta}_{i,360\,Hz}$. This signal $\hat{\theta}_{i,360\,Hz}$ is processed using a "register and increment" algorithm to determine the rate of change in the rotation angle $\Delta\hat{\theta}_{i,360\,Hz}{}^c$. In another processing block 206, the rotation rate $\Omega_i$ is sampled at a specified rate (such as 1,800 Hz) to generate a sampled signal $\hat{\Omega}_{i,1800\,Hz}$. This signal $\hat{\Omega}_{i,1800\,Hz}$ is processed using a third accumulator ACC3, which outputs a signal $\hat{\theta}_{i,1800\,Hz}$ that optionally may be combined with a coning signal (such as a 1,800 Hz signal) to generate a signal $\hat{\theta}_{i,1800\,Hz}{}^c$. That signal $\hat{\theta}_{i,1800\,Hz}{}^c$ is sampled at a specified rate (such as 360 Hz) to generate a sampled signal $\hat{\theta}_{i,360\,Hz}{}^c$, which is processed using a "register and increment" algorithm to determine the rate of change in the rotation angle $\Delta\hat{\theta}_{i,360\,Hz}{}^c$. One or both of these approaches could be used in a particular fiber optic gyroscope, depending on the implementation.

The components in FIGS. 1 and 2 could be implemented in any suitable manner. In some embodiments, most of the components in a fiber optic gyroscope can be implemented using one or more field programmable gate arrays (FPGAs). Other implementations of the fiber optic gyroscope 100 could also be used.

Although FIGS. 1 and 2 illustrate one example of a fiber optic gyroscope 100, various changes may be made to FIGS. 1 and 2. For example, FIGS. 1 and 2 illustrate one example of the way in which signals from a fiber coil 112 can be processed and used in a closed-loop manner. Other or additional techniques could be used to process signals from a fiber optic gyroscope or to control components in a fiber optic gyroscope. Also, techniques other than a 50/50 split could be used to feed signals into the fiber coil 112 and to provide signals to the photodetector 114. In addition, various values given above (such as 360 Hz and 1,800 Hz) are for illustration only, and other values could be used.

FIGS. 3 through 6 illustrate an example method for simulating the operation of a fiber optic gyroscope and related details in accordance with this disclosure. Fiber optic gyroscopes, such as the fiber optic gyroscope 100 of FIG. 1, can be used in various applications. For example, fiber optic gyroscopes can be used as part of an inertial measurement unit (IMU) in guided missiles and vehicles like aircraft, spacecraft, ships, and submarines. Unfortunately, in these types of environments, fiber optic gyroscopes typically experience mechanical vibrations. Sometimes, the mechanical vibrations are greater than the fiber optic gyroscopes are able to handle. However, it is often difficult to know ahead of time whether a particular design for a fiber optic gyroscope is suitable for use in a specific application.

In accordance with this disclosure, a digital simulator and a simulation method are provided for modeling the physics and signal processing characteristics of a fiber optic gyroscope design. Among other things, the simulator and simulation method allow users to model the optics and signal processing of a fiber optic gyroscope with high fidelity. The simulator and simulation method are also able to handle various stimuli, including external data or model-generated data.

Further, the simulator and simulation method allow users to simulate the operation of a fiber optic gyroscope at any point in a simulation. In addition, the simulator and simulation method can handle the mechanization of modern fiber optic gyroscopes using stepped-phase loop closure, which is a widely-used technique in fiber optic gyroscopes. In this way, the simulator and simulation method allow users to assess operation of a particular fiber optic gyroscope, identify potential failures of the particular fiber optic gyroscope, and predict future performance of the particular fiber optic gyroscope.

Figure 3:
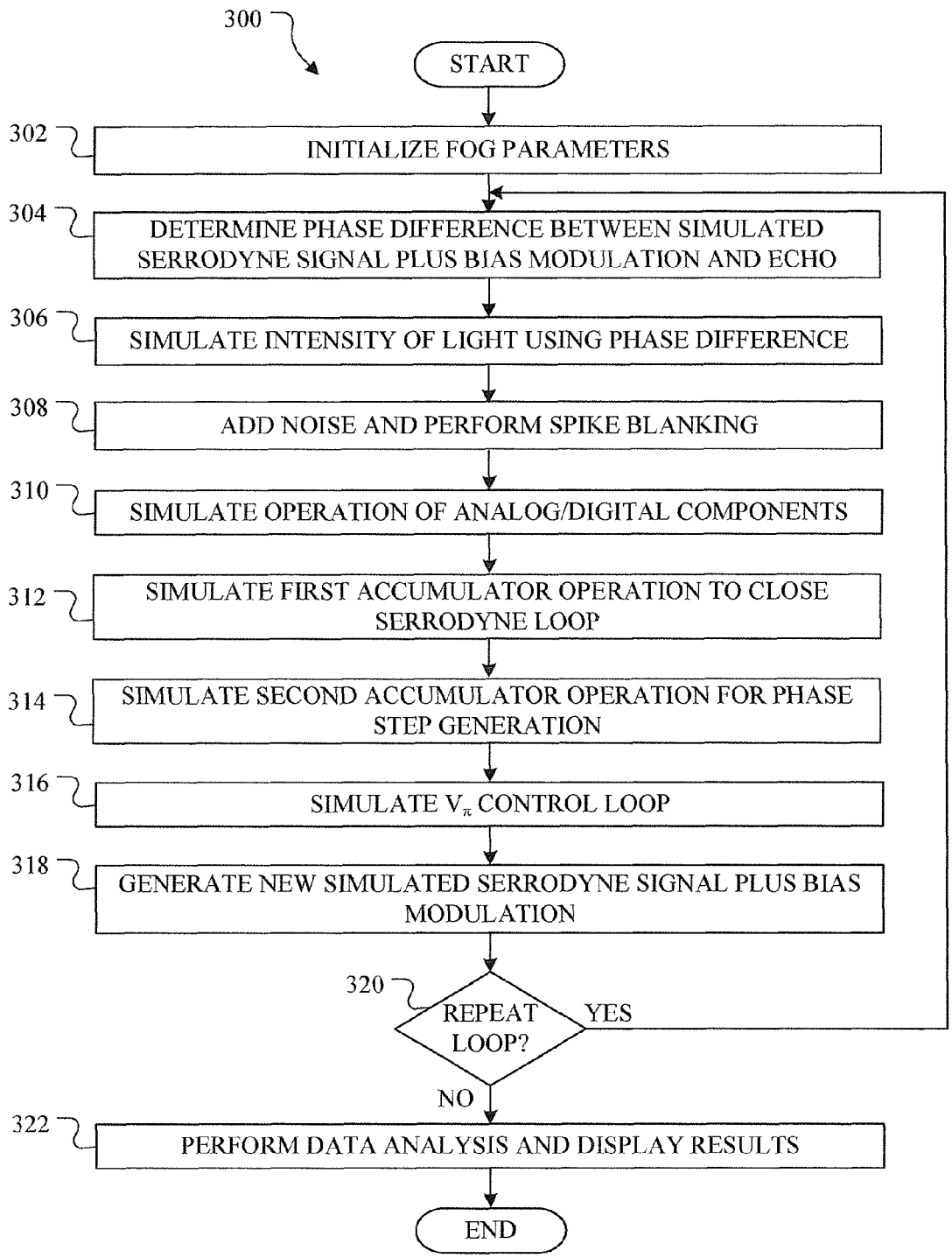
FIGS. 3 through 6 illustrate an example method for simulating the operation of a fiber optic gyroscope and related details in accordance with this disclosure.

FIG. 3 illustrates an example method 300 for simulating the operation of a fiber optic gyroscope in accordance with this disclosure. While described as being used to simulate the operation of the fiber optic gyroscope 100, the same or similar method 300 could be used to simulate the operation of fiber optic gyroscopes having different designs.

As shown in FIG. 3, parameters for a fiber optic gyroscope are initialized at step 302. This could include, for example, calculating the following values:

$$\tau = nL/c \tag{1}$$

$$f_e = 1/(2\tau) \tag{2}$$

Here, $\tau$ represents the loop transit time of the fiber optic gyroscope 100, meaning the amount of time between transmission of light into one end of the fiber coil 112 and the receipt of light from the other end of the fiber coil 112. Also, n represents the refractive index of the fiber coil 112, L represents the length of the fiber coil 112, and c represents the speed of light. In addition, $f_e$ represents the eigenfrequency of the fiber optic gyroscope. The eigenperiod of the fiber optic gyroscope can be calculated as the inverse of the eigenfrequency ($1/f_e$). This step could also include setting the optical power of the fiber optic gyroscope to a specified value (note that the optical power can vary in different simulations to model different behaviors of the fiber optic gyroscope 100).

The method 300 then enters an iterative loop in which steps 304-318 are repeated a number of times. The processing that occurs during the iterative loop to model the physical operation of a fiber optic gyroscope can be done continuously, while the time during which the operation of the fiber optic gyroscope is simulated can be divided into eigenperiods. In other words, while processing data continuously, each iteration of the loop can simulate the operation of the fiber optic gyroscope during one eigenperiod. As a result, the loop is said to iterate at the eigenfrequency of the fiber optic gyroscope. During this loop, a model can be used to represent the Sagnac interferometer equation (associated with the fiber loop 112) and the analog and digital electronics (associated with the components 114-130). The stimulus physics of the fiber coil 112 can be represented continuously using a model or using data associated with an actual coil.

During the iterative loop, a phase difference is determined between (i) a simulated combination of a serrodyne signal and a bias modulation and (ii) its echo at step 304. The combined serrodyne signal and bias modulation can be denoted $\phi(t)$, and the echoed signal can be denoted $\phi(t-\tau)$. This echo exists since the signals entering the fiber coil 112 undergo serrodyne modulation by the modulator 132 at different times. The phase difference $\Delta\phi(t)$ between these signals can be calculated as:

$$\Delta\phi(t) = \phi(t) - \phi(i-\tau) \tag{3}$$

This phase difference $\Delta\phi(t)$ is related to the level of constructive or destructive interference experienced by the light beams traveling in opposite directions through the fiber coil 112.

The intensity of light received from the fiber coil is simulated using the determined phase difference at step 306. The intensity of light is also related to the level of constructive or destructive interference experienced by the light beams traveling in opposite directions through the fiber coil 112. In general, the output intensity of light from the fiber coil 112 (and therefore the current generated by the photodetector 114) can be defined using a raised cosine function. While the use of a raised cosine function is described here, the same function could be implemented using a sine function and a 90° shift. As such, the function used to calculate the intensity can be referred to as a sine/cosine function. In particular embodiments, the following function can be used to simulate the intensity of light from the fiber coil 112 in the fiber optic gyroscope:

$$I(t) = (I_0(t)/2) \times (1 + \cos(\Delta\phi(t) + \Delta\phi_s)) - DC \tag{4}$$

Here, I(t) represents the simulated intensity of light received at the photodetector 114 at time t, and $I_0(t)$ represents the maximum intensity of light received at the photodetector 114. Also, $\Delta\phi_s$ denotes the phase shift induced due to the Sagnac effect, which is caused by rotation of the fiber coil 112. The serrodyne control loop 200 attempts to null out (reduce or eliminate) the Sagnac phase shift $\Delta\phi_s$ by controlling the operation of the phase modulator 132. DC denotes the offset of the analog-to-digital converter 120 and may optionally be used to center the gyroscope's optical response. The DC offset can be omitted if, for example, an ADC is centered at zero. The DC offset can also be omitted if the simulator includes a DC blocking filter in the circuit, such as with a capacitor. The $\Delta\phi_s$ variable here provides a way to inject any angular rate-related effects into the simulation. An "angular rate-related effect" refers to any effect that changes the rotation angle as measured by the gyroscope under simulation, including actual rotation of the fiber coil 112 and mechanical vibrations that affect the gyroscope. By injecting data values for the Sagnac phase shift $\Delta\phi_s$ into the simulated operation of the gyroscope in Equation (4), the operation of the gyroscope can be modeled in any specific environment. The data values for the Sagnac phase shift $\Delta\phi_s$ can be obtained in any suitable manner, such as from a user or a data file.

Noise is added to the simulated operation and spike blanking occurs at step 308. This could include, for example, adding simulated shot noise, photodiode noise, amplifier noise, thermal noise, and relative intensity noise to the I(t) signal. The relative intensity noise may represent noise associated with operation of the light source 102 or with other interfering light sources. This could also include reducing the amplitudes of spikes in the I(t) signal. In particular embodiments, the spike blanking could include retracing over the raised cosine interferometric curve peak during bias modulation.

The operations of various analog and digital components, such as an analog-to-digital converter and a digital modulator, are simulated at step 310. This could include, for example, simulating the outputs generated by the photodetector 116, transimpedance amplifier 118, and analog-to-digital converter 120 assuming the I(t) signal with noise is measured by the photodetector 116. This could also include simulating the operation of the digital demodulator 122 using the simulated outputs of the analog-to-digital converter 120.

The operation of a first accumulator, which is used to close a serrodyne control loop, is simulated at step 312. This could include, for example, simulating the operation of the digital integrator 124 as follows:

$$ACC1\_OLD = ACC1 \tag{5}$$

$$ACC1 = ACC1\_OLD + Z_{MEAN} \tag{6}$$

Here, Equation (5) assigns the old output of the digital accumulator 124 to ACC1_OLD, and Equation (6) assigns a new output ACC1 to the digital accumulator 124. Also, $Z_{MEAN}$ represents the most-recent output from the digital demodulator 122.

The operation of a second accumulator, which is used to generate a serrodyne signal for a phase modulator, is simulated at step 314. This could include, for example, simulating the operation of the serrodyne generator 126 as follows:

$$PHASE\_STEP\_OLD = PHASE\_STEP \quad (7)$$

$$PHASE\_STEP = PHASE\_STEP\_OLD + y \quad (8)$$

Here, Equation (7) assigns the old output of the serrodyne generator 126 to PHASE_STEP_OLD, and Equation (8) assigns a new output PHASE_STEP to the serrodyne generator 126. Also, the value y represents the current ACC1 value as modified by a serrodyne gain factor. This step also assumes that the $V_\pi$ control loop resets.

The operation of a $V_\pi$ control loop is simulated at step 316. This could include, for example, simulating the operation of the $V_\pi$ servo 138 using the simulated digital demodulator outputs. A new or updated serrodyne signal combined with the bias modulation is determined at step 318. This could include, for example, simulating the operation of the IOC driver 130 based on the generated PHASE_STEP value, the bias modulation, and the simulated operation of the $V_\pi$ control loop.

Assuming another iteration of the loop is indicated at step 320, the process returns to step 304, where the loop repeats with the new value of the serrodyne signal combined with the bias modulation. The decision whether to repeat another iteration of the loop can be based on any suitable criteria, such as whether a specified number of iterations have been performed.

If no additional iterations are needed, data analysis can be performed and the results displayed to a user at step 322. This could include, for example, the simulator generating and presenting a graphical display to the user. As a particular example, the graphical display could illustrate the outputs of various components, such as the digital demodulator 122, digital integrator 124, serrodyne generator 126, and IOC driver 130, over the simulated operating time of the gyroscope 100. The display could also illustrate the output measurements of the gyroscope 100 over time. Any other or additional processing or presenting could occur here. In general, this step could involve any storage, output, or use of the data collected during the simulation.

As noted above, the iteration of the steps 304-318 can occur on the eigenfrequency of the fiber optic gyroscope design being simulated, and the integrator states are maintained/propagated within the loop using the accumulators ACC1 and ACC2. The $V_\pi$ servo can be implemented in the same fashion using a loop closure separate from the serrodyne loop closure. Time runs over each eigenperiod in the loop, and processing is done continuously. The final result is a simulation that closely models both the physics of the optics and the signal processing in the fiber optic gyroscope (such as in an FPGA). In this way, the method 300 can be used to simulate the operation of a specific fiber optic gyroscope in a specific environment.

Figure 4:
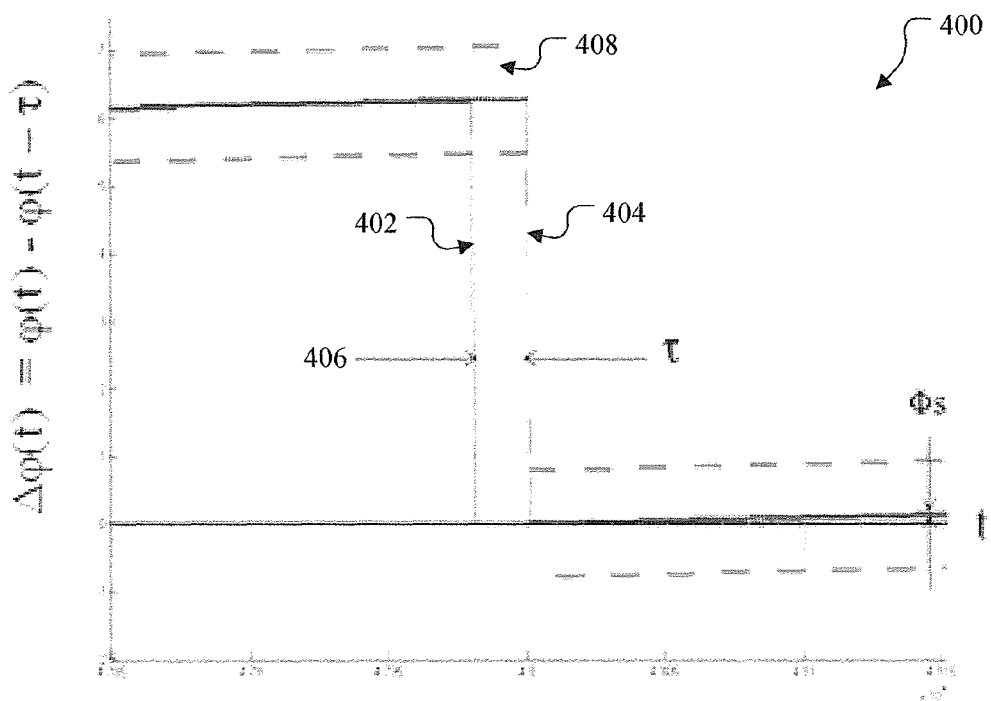

FIG. 4 illustrates an example signal diagram 400 representing signals used in the simulation method 300 of FIG. 3. As shown in FIG. 4, the signal diagram 400 shows two signals 402-404. Signal 402 is denoted $\phi(t)$ and represents the simulated serrodyne signal at time t, and signal 404 is denoted $\phi(t-\tau)$ and represents the echoed signal. As expected, these signals 402-404 have a phase shift 406 of $\tau$. A signal 408 denotes the simulated serrodyne signal combined with simulated bias modulation.

Figure 5A:
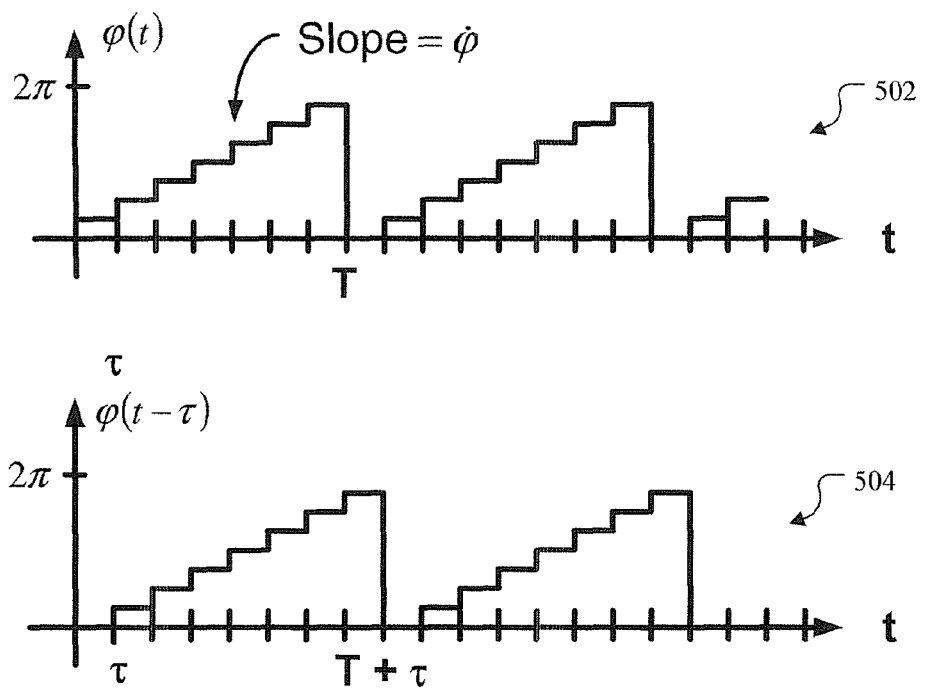
Figure 5B:
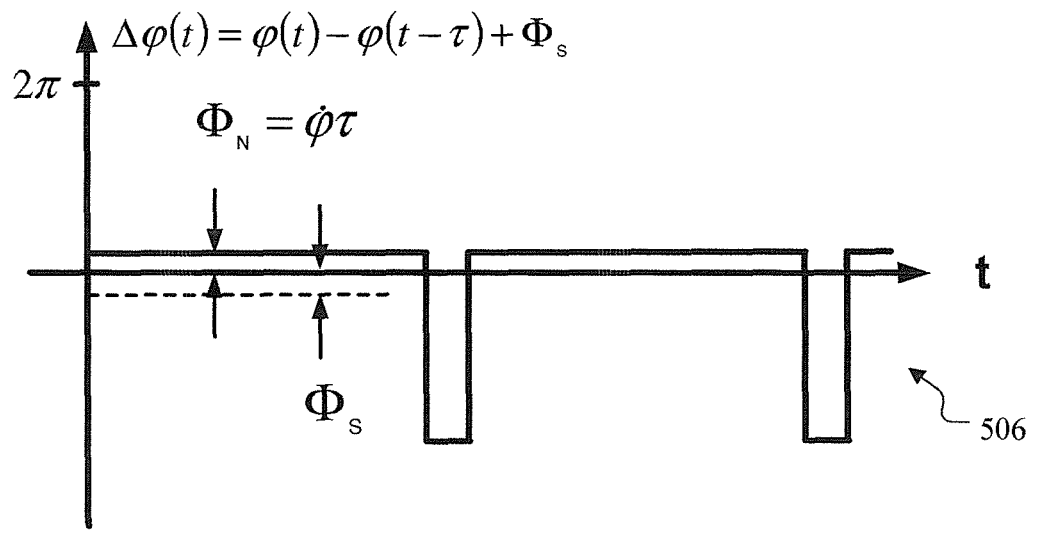

FIGS. 5A through 5D illustrate the theoretical operation of a simulator implementing the method 300. In FIG. 5A, a signal 502 represents the $\phi(t)$ signal, and a signal 504 represents the $\phi(t-\tau)$ signal. In FIG. 5B, a signal 506 represents the phase difference $\Delta\phi(t)$ between the signals 502-504. The signal 506 has also been shifted slightly by an amount expressed as $\Phi_S$, where $\Phi_N$ represents the nulling signal used to null $\Phi_S$.

Figure 5C:
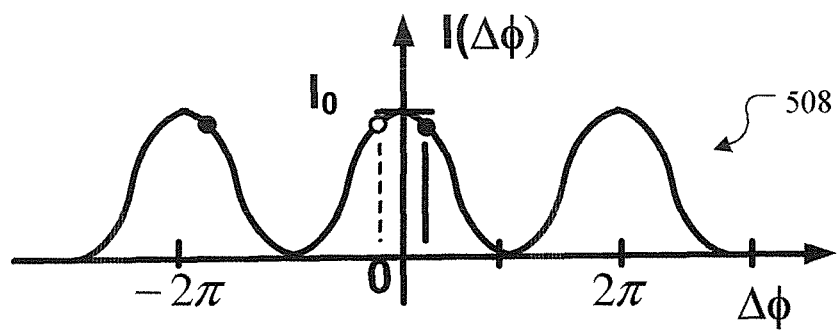
Figure 5D:
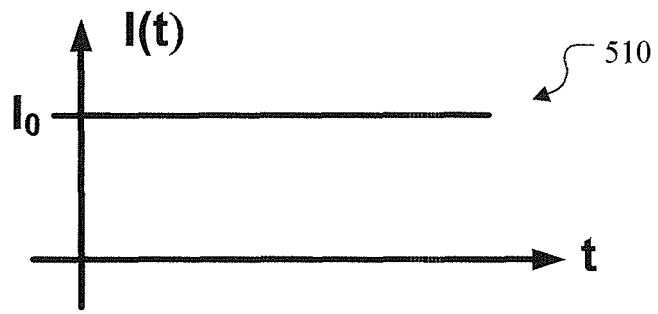

In FIG. 5C, a signal 508 represents the phase difference $\Delta\phi(t)$ converted into an intensity $I(\Delta\phi(t))$. In FIG. 5D, the same intensity is shown as a signal 510 expressed as a function of time I(t). This shows how the phase difference between the $\phi(t)$ signal and the $\phi(t-\tau)$ signal is converted into an intensity, and measurement of this intensity and processing of the measurement by the gyroscope 100 can be simulated to drive the Sagnac phase shift to zero.

Figure 6:
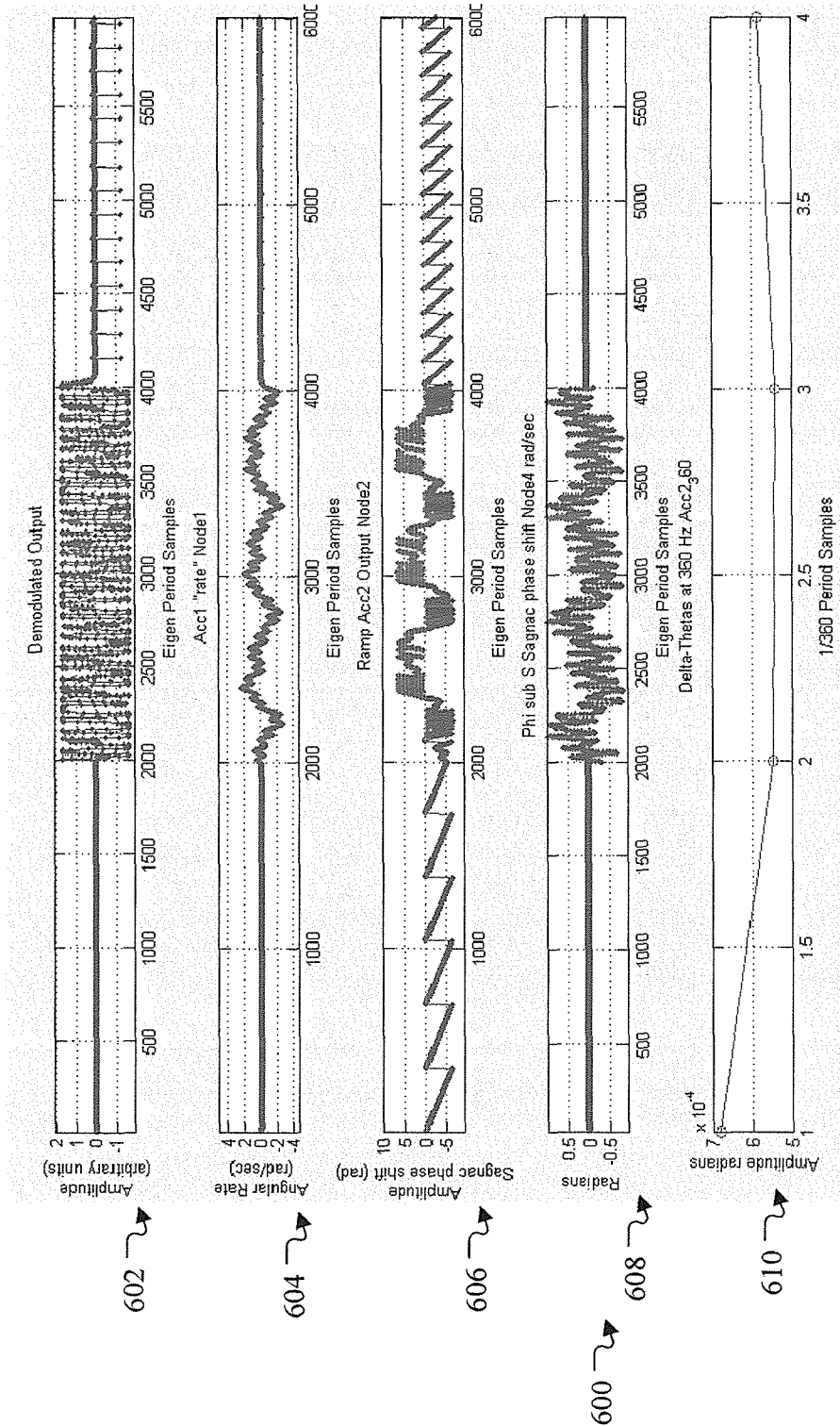

FIG. 6 illustrates an example graphical user interface 600 that can be generated to represent the results of simulating the operation of a fiber optic gyroscope. As shown in FIG. 6, the interface 600 includes five plots 602-610. The plot 602 identifies the simulated output of the digital demodulator 122 over approximately 6,000 eigenperiods. As part of this, the plot 602 indicates that the analog-to-digital converter 120 saturates periodically during the 4,000 to 6,000 eigenperiods, which shows up in the output of the demodulator 122. The plot 604 identifies the simulated output of the digital integrator 124 (implemented as the accumulator ACC1). The plot 606 identifies the simulated output of the serrodyne generator 126 (implemented as the accumulator ACC2). The plot 608 identifies the Sagnac phase shifts that are applied during the simulation, such as by feeding these $\Delta\phi_s$ values into Equation (4) during the simulation. The plot 610 identifies the simulated $\Delta\hat{\theta}_{i,360\ Hz}^c$ values calculated during the simulation. Among other things, the graphical user interface 600 allows a user to view the simulated operation of the fiber optic gyroscope at various points during the simulation.

To summarize, the simulation method 300 executes an algorithm that iterates at the eigenfrequency of a fiber optic gyroscope and uses a first integrator to close a serrodyne control loop and a second integrator to generate a serrodyne output signal. The serrodyne signal plus the bias modulation is applied through the equations $\phi(t)$ and $\phi(t-\tau)$, and a raised cosine function is used to null out an applied Sagnac phase shift $\Delta\phi_s$. The Sagnac phase shift $\Delta\phi_s$ may be a function of time, and it can be selectable within the loop, read from a file stored locally or remotely, defined by the user, or obtained in any other suitable manner to simulate any stimulus. The intensity modulation of the gyroscope can be varied and studied, such as by executing the method 300 multiple times with different optical powers. Moreover, the looping on the eigenperiod and accessing the internal physics (such as the photocurrent signal) provides the ability to control the $V_\pi$(rad/volt) scale factor, and several techniques can be used to simulate the $V_\pi$ methodology. In addition, the output values $\Delta\theta$ can be obtained either at the first accumulator ACC1 or at the second accumulator ACC2 to generate angle samples. The increment algorithm $(1-z^{-1})$ can be implemented using an estimator from the angular rate node or directly from the phase-step accumulator ACC2. The mathematics in the simulation can be performed using floating point calculations, accomplished in 2's complement calculations, or performed in any other suitable manner. The method 300 supports the application of any stimulus, observation of internal dynamics, and observation of output responses.

Although FIGS. 3 through 6 illustrate one example of a method 300 for simulating the operation of a fiber optic gyroscope and related details, various changes may be made to FIGS. 3 through 6. For example, while FIG. 3 is shown as including a series of steps, various steps in FIG. 3 could overlap, occur in parallel, or occur in a different order. Also, the signals shown in FIGS. 4 through 6 are for illustration only, and other signals can be generated or associated with a simulation of a fiber optic gyroscopic.

The simulation method 300 of FIG. 3 could be implemented in any suitable manner. In some embodiments, the method 300 could be implemented using only hardware or using a combination of hardware and software/firmware. If implemented in software/firmware, any suitable programming language could be used, such as MATLAB, C, C++, OBJECTIVE C, or other language(s).

Figure 7:
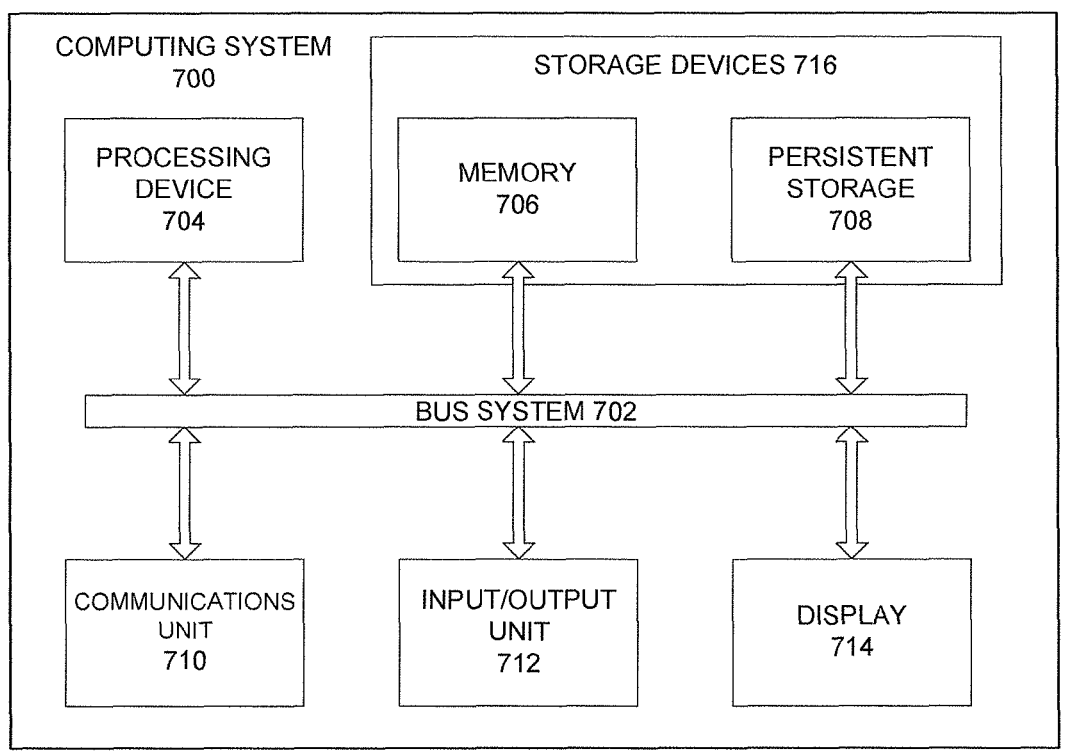
FIG. 7 illustrates an example system for simulating the operation of a fiber optic gyroscope in accordance with this disclosure.

FIG. 7 illustrates an example system 700 for simulating the operation of a fiber optic gyroscope in accordance with this disclosure. In this example, the system 700 represents a computing system that can execute instructions for implementing the simulation method 300. As shown in FIG. 7, the system 700 includes a bus system 702, which supports communications between at least one processing device 704, at least one memory 706, at least one persistent storage device 708, at least one communications unit 710, at least one input/output (I/O) unit 712, and at least one display 714.

The processing device 704 processes instructions in software that may be loaded into the memory 706. The processing device 704 may include one or more microprocessors, microcontrollers, digital signal processors, or other type(s) of processing device(s) depending on the implementation. As a particular example, the processing device 704 may be implemented using a number of heterogeneous processor systems in which a main processor is present with secondary processors on a single chip. As another particular example, the processing device 704 may be a symmetric multi-processor system containing multiple processors of the same type.

The memory 706 and the persistent storage device 708 are examples of storage devices 716. A storage device is any piece of hardware capable of storing information, such as data, program code, and/or other suitable information on a temporary or permanent basis. The memory 706 here may be, for example, a random access memory or any other suitable volatile and/or non-volatile storage device(s). The persistent storage device 708 may contain one or more components or devices such as a hard drive, flash memory, optical disc drive, rewritable magnetic tape, or any other type(s) of persistent storage device(s). The media used by the persistent storage device 708 also may be removable, such as when a removable hard drive is used as the persistent storage device 708.

The communications unit 710 provides for communications with other systems or devices. For example, the communications unit 710 could include a network interface card or a wireless transceiver. The communications unit 710 may support the exchange of any suitable information, such as data used during simulation of a fiber optic gyroscope or simulation results. The communications unit 710 may provide communications through physical or wireless communications links.

The input/output unit 712 allows for input and output of data using other devices that may be connected to the computer system. For example, the input/output unit 712 may provide a connection for user input through a keyboard, mouse, or other suitable input device(s). The input/output unit 712 may also send output to a display, printer, or other suitable output device(s). The display 714 provides a mechanism to visually present information to a user.

Program code for an operating system, applications, or other programs can be stored in one or more of the storage devices 716, provided to the processing device 704, and executed by the processing device 704. The applications executed by the processing device 704 can include an application that performs the simulation method 300 described above.

Although FIG. 7 illustrates one example of a system 700 for simulating the operation of a fiber optic gyroscope, various changes may be made to FIG. 7. For example, the simulation method could be executed by any other suitable centralized or decentralized computing or processing system.

In some embodiments, various functions described above are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
   simulating operation of a fiber optic gyroscope during a digital simulation, wherein the simulation comprises performing an iterative loop at an eigenfrequency of the fiber optic gyroscope, the iterative loop including:
   simulating an intensity of light from a fiber coil of the fiber optic gyroscope, wherein the intensity of the light is simulated using a sine or cosine function based on at least one angular rate-related effect injected into the simulation as a Sagnac phase shift; and
   simulating operation of one or more control loops within the fiber optic gyroscope using the simulated intensity of the light, wherein the simulated operation of a first of the one or more control loops attempts to reduce or eliminate the Sagnac phase shift; and at least one of: storing, outputting, and using results of the simulation.

2. The method of claim 1, wherein simulating the intensity of the light comprises:

determining a phase difference between (i) a combination of a simulated serrodyne signal and a bias modulation in the fiber optic gyroscope and (ii) an echo of the combination of the simulated serrodyne signal and the bias modulation; and determining the intensity of the light using the phase difference.

3. The method of claim 2, wherein determining the intensity of the light using the phase difference comprises using a formula of:

$$I(t)=(I_0(t)/2)\times(1+\cos(\Delta\phi(t)+\Delta\phi_s))-DC$$

wherein I(t) represents the intensity of the light at time t, $I_0(t)$ represents a maximum intensity of light from the fiber coil, $\Delta\phi(t)$ represents the phase difference, $\Delta\phi_s$ represents the Sagnac phase shift, and DC is optional and represents an offset of an analog-to-digital converter in the fiber optic gyroscope.

4. The method of claim 2, wherein simulating the operation of the one or more control loops comprises generating an updated combination of the simulated serrodyne signal and the bias modulation.

5. The method of claim 1, wherein simulating the operation of the one or more control loops comprises:

using a first accumulator to simulate generation of rotation rate values in the first control loop of the fiber optic gyroscope; and using a second accumulator to simulate generation of rotation angle values using the rotation rate values in the first control loop of the fiber optic gyroscope.

6. The method of claim 5, wherein simulating the operation of the one or more control loops further comprises:

adding noise to the simulated intensity of the light;

simulating measurements of the simulated intensity of the light; and simulating demodulation of the measurements to generate demodulated values;

wherein the rotation rate values are based on the demodulated values.

7. The method of claim 6, wherein simulating the operation of the one or more control loops further comprises:

simulating operation of a second of the control loops using the demodulated values.

8. The method of claim 6, wherein at least one of: storing, outputting, and using the results of the simulation comprises:

generating a graphical display illustrating the demodulated values, the rotation rate values, the rotation angle values, and the Sagnac phase shift over time.

9. The method of claim 1, wherein each iteration of the iterative loop is performed using an updated value of a simulated serrodyne signal.

10. The method of claim 1, wherein the at least one angular rate-related effect comprises at least one of: rotation of the fiber coil and mechanical vibration of the fiber coil.

11. An apparatus comprising:

at least one processing device configured to simulate operation of a fiber optic gyroscope during a digital simulation, wherein the simulation comprises an iterative loop performed at an eigenfrequency of the fiber optic gyroscope, wherein during the iterative loop the at least one processing device is configured to:

simulate an intensity of light from a fiber coil of the fiber optic gyroscope, wherein the at least one processing device is configured to simulate the intensity of the light using a sine or cosine function based on at least one angular rate-related effect injected into the simulation as a Sagnac phase shift; and simulate operation of one or more control loops within the fiber optic gyroscope using the simulated intensity of the light, wherein the at least one processing device is configured to simulate operation of a first of the one or more control loops in order to reduce or eliminate the Sagnac phase shift; and at least one memory configured to store results of the simulation.

12. The apparatus of claim 11, wherein the at least one processing device is configured to:

determine a phase difference between (i) a combination of a simulated serrodyne signal and a bias modulation in the fiber optic gyroscope and (ii) an echo of the combination of the simulated serrodyne signal and the bias modulation; and determine the intensity of the light using the phase difference.

13. The apparatus of claim 12, wherein the at least one processing device is configured to determine the intensity of the light using a formula of:

$$I(t)=(I_0(t)/2)\times(1+\cos(\Delta\phi(t)+\Delta\phi_s))-DC$$

wherein I(t) represents the intensity of the light at time t, $I_0(t)$ represents a maximum intensity of light from the fiber coil, $\Delta\phi(t)$ represents the phase difference, $\Delta\phi_s$ represents the Sagnac phase shift, and DC is optional and represents an offset of an analog-to-digital converter in the fiber optic gyroscope.

14. The apparatus of claim 11, wherein the at least one processing device is configured to:

use a first accumulator to simulate generation of rotation rate values in the first control loop of the fiber optic gyroscope; and use a second accumulator to simulate generation of rotation angle values using the rotation rate values in the first control loop of the fiber optic gyroscope.

15. The apparatus of claim 14, wherein the at least one processing device is configured to:

add noise to the simulated intensity of the light;

simulate measurements of the simulated intensity of the light; and simulate demodulation of the measurements to generate demodulated values;

wherein the rotation rate values are based on the demodulated values.

16. The apparatus of claim 15, wherein the at least one processing device is configured to simulate operation of a second of the control loops using the demodulated values.

17. The apparatus of claim 11, wherein the at least one processing device is configured to perform each iteration of the iterative loop using an updated value of a simulated serrodyne signal.

18. A non-transitory computer readable medium embodying a computer program, the computer program comprising computer readable program code for simulating operation of a fiber optic gyroscope during a digital simulation, wherein the computer readable program code for simulating comprises computer readable program code for, in an iterative loop:

simulating an intensity of light from a fiber coil of the fiber optic gyroscope, wherein the intensity of the light is simulated using a sine or cosine function based on at least one angular rate-related effect injected into the simulation as a Sagnac phase shift; and simulating operation of one or more control loops within the fiber optic gyroscope using the simulated intensity of the light, wherein the simulated operation of a first of the one or more control loops attempts to reduce or eliminate the Sagnac phase shift;

wherein the iterative loop is performed at an eigenfrequency of the fiber optic gyroscope.

19. The computer readable medium of claim 18, wherein the computer readable program code for simulating the intensity of the light comprises:

computer readable program code for determining a phase difference between (i) a combination of a simulated serrodyne signal and a bias modulation in the fiber optic gyroscope and (ii) an echo of the combination of the simulated serrodyne signal and the bias modulation; and computer readable program code for determining the intensity of the light using a formula of:

$$I(t)=(I_0(t)/2)\times(1+\cos(\Delta\phi(t)+\Delta\phi_s))-DC$$

wherein I(t) represents the intensity of the light at time t, $I_0(t)$ represents a maximum intensity of light from the fiber coil, $\Delta\phi(t)$ represents the phase difference, $\Delta\phi_s$ represents the Sagnac phase shift, and DC is optional and represents an offset of an analog-to-digital converter in the fiber optic gyroscope.

20. The computer readable medium of claim 18, wherein the computer readable program code for simulating the operation of the one or more control loops comprises:

computer readable program code for using a first accumulator to simulate generation of rotation rate values in the first control loop of the fiber optic gyroscope; and computer readable program code for using a second accumulator to simulate generation of rotation angle values using the rotation rate values in the first control loop of the fiber optic gyroscope.

21. The computer readable medium of claim 20, wherein the computer readable program code for simulating the operation of the one or more control loops further comprises:

computer readable program code for simulating measurements of the simulated intensity of the light;

computer readable program code for simulating demodulation of the measurements to generate demodulated values, wherein the rotation rate values are based on the demodulated values; and computer readable program code for simulating operation of a second of the control loops using the demodulated values.

* * * * *